United States Patent
Loh et al.

(10) Patent No.: US 8,791,491 B2
(45) Date of Patent: Jul. 29, 2014

(54) SEMICONDUCTOR LIGHT EMITTING DEVICE PACKAGES AND METHODS

(75) Inventors: Ban P. Loh, Durham, NC (US); Nathaniel O. Cannon, Morrisville, NC (US); Norbert Hiller, Chapel Hill, NC (US); John Edmond, Durham, NC (US); Mitch Jackson, Raleigh, NC (US); Nicholas W. Medendorp, Jr., Raleigh, NC (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 13/164,185

(22) Filed: Jun. 20, 2011

(65) Prior Publication Data

US 2011/0284903 A1 Nov. 24, 2011

Related U.S. Application Data

(62) Division of application No. 11/788,001, filed on Apr. 18, 2007, now Pat. No. 7,964,888.

(51) Int. Cl.
*H01L 33/00* (2010.01)
*H01L 33/48* (2010.01)
*H01L 33/62* (2010.01)

(52) U.S. Cl.
CPC .............. *H01L 33/486* (2013.01); *H01L 33/62* (2013.01)
USPC ............... 257/99; 257/E33.066; 257/E29.064

(58) Field of Classification Search
CPC . H01L 33/62; H01L 33/486; H01L 2224/48091
USPC ................ 257/99, E33.066, E29.064
See application file for complete search history.

(56) References Cited

U.S. PATENT DOCUMENTS

| 4,843,280 | A | 6/1989 | Lumbard et al. |
| 5,998,925 | A | 12/1999 | Shimizu et al. |

(Continued)

FOREIGN PATENT DOCUMENTS

| JP | 7-131072 | 5/1995 |
| JP | 2002/518692 A | 10/2001 |
| JP | 2002-009347 A | 1/2002 |
| JP | 2002-314138 A | 10/2002 |
| WO | WO 99/07023 A1 | 2/1999 |

OTHER PUBLICATIONS

U.S. Appl. No. 11/412,381, filed Apr. 27, 2006, Loh et al.

(Continued)

*Primary Examiner* — Dale E Page
(74) *Attorney, Agent, or Firm* — Myers Bigel Sibley & Sajovec, P.A.

(57) ABSTRACT

A submount for a light emitting device package includes a substrate. A first bond pad and a second bond pad are on a first surface of the substrate. The first bond pad includes a die attach region offset toward a first end of the substrate and configured to receive a light emitting diode thereon. The second bond pad includes a bonding region between the first bond pad and the second end of the substrate and a second bond pad extension that extends from the bonding region along a side of the substrate toward a corner of the substrate at the first end of the substrate. First and second solder pads are a the second surface of the substrate. The first solder pad is adjacent the first end of the substrate and contacts the second bond pad. The second solder pad is adjacent the second end of the substrate and contacts the first bond pad. Related LED packages and methods of forming LED packages are disclosed.

19 Claims, 11 Drawing Sheets

(56) References Cited

U.S. PATENT DOCUMENTS

| | | | |
|---|---|---|---|
| 6,204,523 | B1 | 3/2001 | Carey et al. |
| 6,297,598 | B1 | 10/2001 | Wang et al. ............... 315/169.3 |
| 6,518,600 | B1 | 2/2003 | Shaddock |
| 6,521,916 | B2 | 2/2003 | Roberts et al. |
| 7,126,274 | B2 | 10/2006 | Shimizu et al. |
| 7,215,074 | B2 | 5/2007 | Shimizu et al. |
| 7,355,284 | B2 | 4/2008 | Negley |
| 2001/0042858 | A1 | 11/2001 | Ishinaga |
| 2003/0168670 | A1 | 9/2003 | Roberts et al. |
| 2004/0041222 | A1 | 3/2004 | Loh et al. |
| 2004/0079957 | A1* | 4/2004 | Andrews et al. ............. 257/100 |
| 2004/0126913 | A1 | 7/2004 | Loh et al. |
| 2004/0188851 | A1 | 9/2004 | Takewaki et al. ............. 257/774 |
| 2005/0167679 | A1 | 8/2005 | Ishii et al. ...................... 257/79 |
| 2005/0184625 | A1* | 8/2005 | Miyazaki ..................... 310/348 |
| 2005/0269587 | A1 | 12/2005 | Loh et al. |
| 2005/0270666 | A1 | 12/2005 | Loh et al. |
| 2006/0292747 | A1 | 12/2006 | Loh et al. |

OTHER PUBLICATIONS

U.S. Appl. No. 11/336,369, filed Jan. 20, 2006, Andrews.

U.S. Appl. No. 11/657,347, filed Jan. 24, 2006, Loh et al.

Invitation To Pay Additional Fees And, Where Applicable, Protest Fee (7 pages) corresponding to International Application No. PCT/US2008/004849; Mailing date: Aug. 12, 2008.

International Search Report and Written Opinion (19 pages) corresponding to International Application No. PCT/US2008/004849; Mailing Date: Oct. 31, 2008.

U.S. Appl. No. 11/751,990, filed May 22, 2007, Negley.

International Search Report and Written Opinion (6 pages) corresponding to International Application No. PCT/US07/12158; Mailing Date: Jun. 9, 2008.

Notification of Transmittal of International Preliminary Report on Patentability (11 pages) corresponding to International Application No. PCT/US07/12158; Mailing Date: Nov. 3, 2008.

International Search Report and Written Opinion (9 pages) corresponding to International Application No. PCT/US07/12158; Mailing Date: May 2, 2008.

Japanese Office Action Corresponding to Japanese Patent Application No. 2010-504064; Mailing Date: Feb. 14, 2012; Japanese Text, 2 pages, English Translation, thereof, 4 pages.

Japanese Office Action Corresponding to Japanese Patent Application No. 2010-504064; Mailing Date: Dec. 7, 2012; Foreign Text, 4 Pages, English Translation Thereof, 3 Pages.

* cited by examiner

SEMICONDUCTOR LIGHT EMITTING DEVICE PACKAGES AND METHODS

RELATED APPLICATION

This application is a divisional of U.S. patent application Ser. No. 11/788,001 filed on Apr. 18, 2007 now U.S. Pat. No. 7,964,888 entitled, "Semiconductor Light Emitting Device Packages and Methods", the specification of which is incorporated herein by reference in its entirety.

FIELD OF THE INVENTION

This invention relates to semiconductor light emitting devices, and more particularly to packages for semiconductor light emitting devices.

BACKGROUND

Light emitting diodes and laser diodes are well known solid state electronic devices capable of generating light upon application of a sufficient voltage. Light emitting diodes and laser diodes may be generally referred to as light emitting devices (LEDs). Light emitting devices generally include a p-n junction formed in an epitaxial layer grown on a substrate such as sapphire, silicon, silicon carbide, gallium arsenide and the like. The wavelength distribution of the light generated by the LED depends on the material from which the p-n junction is fabricated and the structure of the thin epitaxial layers that include the active region of the device.

Typically, an LED includes a substrate, an n-type epitaxial region formed on the substrate and a p-type epitaxial region formed on the n-type epitaxial region (or vice-versa). In order to facilitate the application of a voltage to the device, an anode ohmic contact is formed on a p-type region of the device (typically, an exposed p-type epitaxial layer) and a cathode ohmic contact is formed on an n-type region of the device (such as the substrate or an exposed n-type epitaxial layer).

In order to use an LED in a circuit, it is desirable to package the LED to protect it from environmental harm and mechanical damage. An LED package also includes means, such as electrical leads, for electrically connecting the LED chip to an external circuit. In a typical package 10 illustrated in FIG. 1A, an LED 12 is mounted on a reflective cup 13 by means of a solder bond or epoxy. One or more wirebonds connect the ohmic contacts of the LED to leads 15A, 15B which may be attached to or integral with the reflective cup 13. The entire assembly is then encapsulated in a clear protective resin 14 which may be molded in the shape of a lens to collimate the light emitted from the LED chip 12.

In another conventional package 20 illustrated in FIG. 1B, a plurality of LED chips 22 are mounted onto a printed circuit board (PCB) carrier 23. One or more wirebond connections are made between ohmic contacts on the LEDs 22 and electrical traces 25A, 25B on the PCB 23. Each mounted LED 22 is then covered with a drop of clear resin 24 which may provide environmental and mechanical protection to the chip while also acting as a lens. The individual packaged LEDs 22 are then separated by sawing the PCB board 23 into small squares, each of which contains one or more LED chips 22.

One figure of merit for users of light emitting devices is cost per lumen, that is, the cost of obtaining a given level of light output. The high cost of conventional packaging techniques may be one factor that keeps the cost per lumen of solid state lighting relatively high. In addition, conventional packaging techniques may result in large, bulky packages that are unsuitable for certain miniaturized applications such as cellular telephone backlights. Conventional packaging techniques may also have poor thermal resistance characteristics that limit the power levels at which the LED chip may be driven and place constraints on system designers with respect to placement of LEDs.

Some packages for light emitting diodes are described in U.S. Pre-grant Publication Nos. 2004/0079957, 2004/0126913, and 2005/0269587 which are assigned to the assignee of the present invention, and which are incorporated herein by reference as if set forth fully herein.

SUMMARY

Some embodiments of the invention provide a submount for a light emitting device package. The submount includes a generally rectangular substrate having a first surface and a second surface opposite the first surface, a first end and a second end opposite the first end. A first bond pad and a second bond pad are on the first surface of the substrate. The first bond pad may include a die attach region offset toward the first end of the substrate and configured to receive a light emitting diode thereon. The second bond pad may include a bonding region that is between the first bond pad and the second end of the substrate and a second bond pad extension that extends from the bonding region along a side of the substrate toward a corner of the substrate at the first end of the substrate.

The substrate further includes first and second solder pads on the second surface of the substrate. The first solder pad is adjacent the first end of the substrate and the second solder pad is adjacent the second end of the substrate. The second bond pad is in electrical contact with the first solder pad, and the first bond pad is in electrical contact with the second solder pad.

The substrate may include a castellation at the corner of the substrate and an electrical trace on the castellation that extends from the first surface of the substrate to the second surface of the substrate and that electrically connects the second bond pad and the first solder pad.

The side of the substrate may include a first side and the corner of the substrate may include a first corner, and the first bond pad may further include a first bond pad extension that extends from the die attach region along a second side of the substrate, opposite the first side of the substrate, towards a second corner of the substrate at the second end of the substrate and diagonally opposed to the first corner.

The substrate may include a castellation at the second corner of the substrate. A second electrical trace may be on the second castellation and may extend from the first surface of the substrate to the second surface of the substrate to electrically connect the first bond pad and the second solder pad.

The submount may further include a neutral pad on the second surface of the substrate between the first solder pad and the second solder pad. The neutral pad may be electrically isolated from the first solder pad and the second solder pad.

The substrate may include an electrically insulating material, such as aluminum nitride, silicon carbide, diamond, and/or alumina.

The submount may further include at least one via hole through the substrate extending from the first surface of the substrate to the second surface of the substrate. A conductive material may be in the at least one via hole and may electrically connect the first bond pad and the second solder pad.

The first bond pad may include a seed layer on the substrate and a thermal spreading layer on the seed layer. The thermal spreading layer may include a layer of copper having a thickness greater than about 5 µm.

The first bond pad may further include a barrier layer on the thermal spreading layer opposite the seed layer, and a reflective layer on the barrier layer opposite the thermal spreading layer. The first bond pad may further include second barrier layer between the seed layer and the thermal spreading layer.

A light emitting device package according to some embodiments of the invention includes a generally rectangular substrate having a first surface and a second surface opposite the first surface, a first end and a second end opposite the first end, and a first bond pad on the first surface of the substrate. The first bond pad may include a die attach region offset from a center of the first surface toward the first end of the substrate and configured to receive a light emitting diode thereon. The substrate may further include a second bond pad on the first surface of the substrate including a bonding region that is between the first bond pad and the second end of the substrate, and a second bond pad extension that extends from the bonding region along a side of the substrate toward a corner of the substrate at the first end of the substrate.

The substrate further includes first and second solder pads on the second surface of the substrate. The first solder pad is adjacent the first end of the substrate and the second solder pad is adjacent the second end of the substrate. The second bond pad is in electrical contact with the first solder pad, and the first bond pad is in electrical contact with the second solder pad.

A light emitting device having an electrical contact is mounted on the first bond pad, and a bond wire is bonded to the electrical contact of the light emitting device and to the second bond pad.

An encapsulant may be on the first surface of the substrate. The encapsulant may include an integrated lens arranged over the light emitting device. The integrated lens may have an optical axis that is aligned over a center of the light emitting device, so that the integrated lens is offset from a center of the substrate toward the first end of the substrate.

The package may further include an ESD protection chip including an electrical contact, the ESD protection chip mounted on the first bond pad, and a second bond wire electrically connecting the electrical contact of the ESD protection chip and the second bond pad.

The encapsulant may include a wavelength conversion material and/or a disperser. In some embodiments, the package may include a wavelength conversion material between the light emitting device and the encapsulant. The package may further include a secondary optical element on the encapsulant.

Some embodiments of the invention provide methods of forming a submount for a light emitting diode (LED) package. The methods include providing a generally rectangular substrate having a first surface and a second surface opposite the first surface, a first end and a second end opposite the first end, a first corner at the first end and a second corner at the second end and diagonally across the substrate from the first corner. A seed layer is formed on the first surface of the substrate, and is patterned to form a first bond pad pattern and a second bond pad pattern on the first surface of the substrate.

A first bond pad is formed on the first bond pad pattern. The first bond pad may include a die attach region offset from a center of the first surface toward the first end of the substrate and configured to receive a light emitting diode thereon. A second bond pad is formed on the second bond pad pattern. The second bond pad may include a bonding region that is between the first bond pad and the second end of the substrate and a second bond pad extension that extends from the bonding region along a side of the substrate toward a corner of the substrate at the first end of the substrate. The methods further include etching the first bond pad and the second bond pad to increase a separation between the first bond pad and the second bond pad.

The methods may further include forming first and second solder pads on the second surface of the substrate. The first solder pad may be formed adjacent the first end of the substrate and the second solder pad may be formed adjacent the second end of the substrate. The second bond pad may be in electrical contact with the first solder pad and the first bond pad may be in electrical contact with the second solder pad.

The methods may further include removing material from the first corner and the second corner to provide respective first and second castellations at the first corner and the second corner. A first electrical via may be formed on the first castellation to electrically connect the second bond pad and the first solder pad. A second electrical via may be formed on the second castellation to electrically connect the first bond pad and the second solder pad.

Some embodiments of the invention provide methods of forming a plurality of packaged light emitting diodes. The methods include providing a sheet of ceramic material including a two-dimensional array of light emitting devices mounted thereon, providing a mold including a plurality of cavities therein, dispensing a liquid encapsulant material into respective ones of the plurality of cavities, and bringing the sheet of ceramic material into contact with the mold so that respective ones of the light emitting devices extend into a corresponding one of the plurality of cavities. The liquid encapsulant is at least partially cured so as to form encapsulant coatings around the respective light emitting devices.

The sheet of ceramic material may include a plurality of metallized holes therethrough, and the methods may further include separating the sheet of ceramic material along separation lines that extend through a subset of the plurality of holes to thereby define individual light emitting diode substrates including at least one castellation at a corner thereof including an electrical via thereon extending from a first surface of a substrate to a second surface of the substrate.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1A:
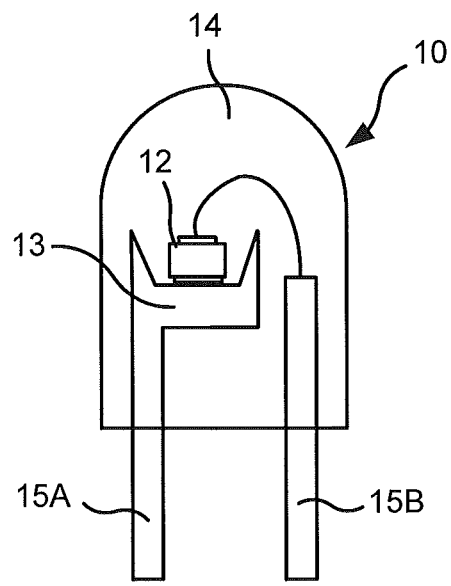
FIGS. 1A and 1B illustrate some conventional packaged light emitting devices (LEDs).
Figure 1B:
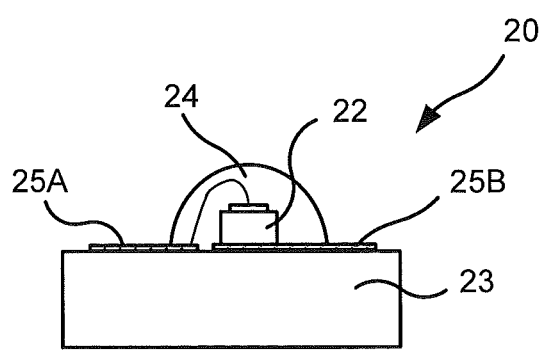

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. It will be understood that if part of an element, such as a surface, is referred to as "inner," it is farther from the outside of the device than other parts of the element. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

As used herein, the term semiconductor light emitting device may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers. In some embodiments, ultraviolet, blue and/or green light emitting diodes ("LEDs") may be provided. Red and/or amber LEDs may also be provided. The design and fabrication of semiconductor light emitting devices are well known to those having skill in the art and need not be described in detail herein.

Figure 2A:
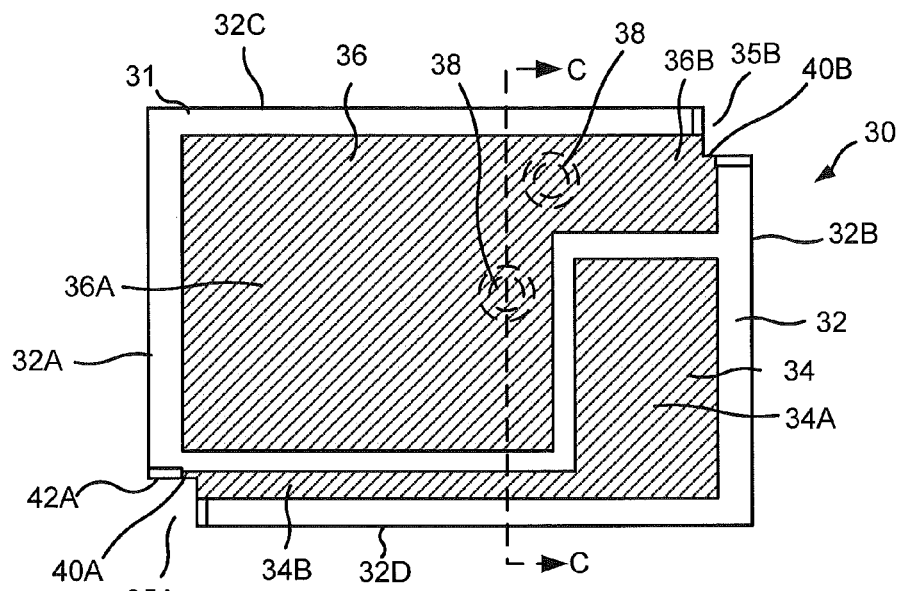
FIGS. 2A to 2C are plan, bottom and sectional views, respectively, of a submount for an LED package according to some embodiments of the invention.
Figure 2B:
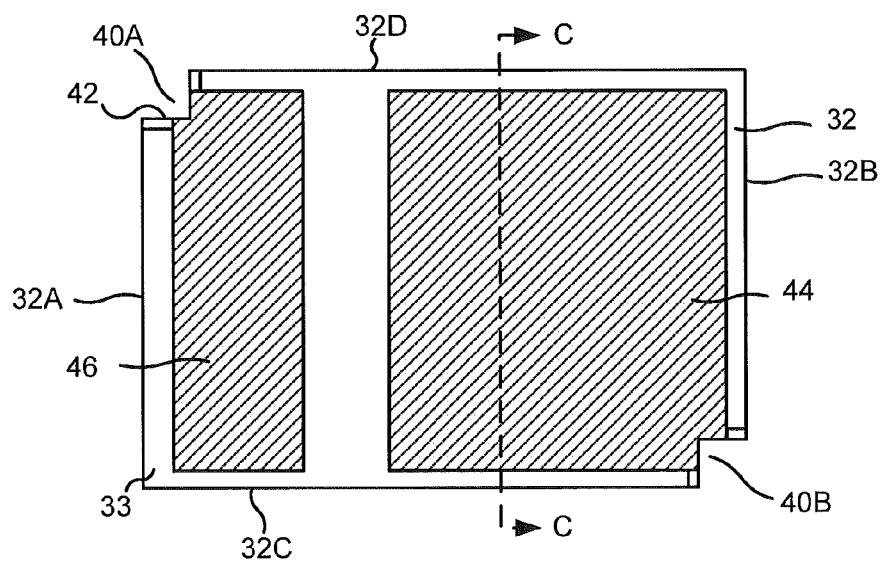
Figure 2C:
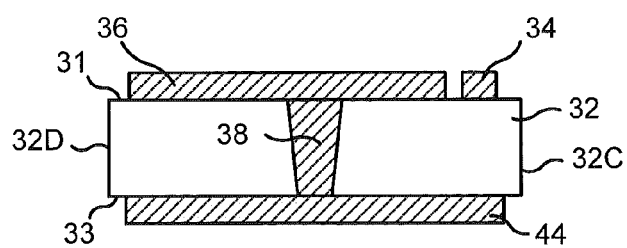

FIGS. 2A to 2C are plan, bottom and sectional views, respectively, of a submount 30 for an LED package according to some embodiments of the invention. In particular, FIG. 2C is a cross section of the submount 30 taken along line C-C of FIGS. 2A and 2B.

Referring to FIGS. 2A to 2C, a submount 30 includes a generally rectangular substrate 32 having a first side 31 and a second side 33. A first bondpad 36 and a second bond pad 34 are formed on the first side 31 of the substrate 32. The first bond pad 36 includes a die attach region 36A that is offset from a center of the substrate 32 towards a first end 32A of the substrate 32. The second bond pad 34 includes a bonding region 34A that is between the die attach region 36A and a second end 32B of the substrate 32, that is opposite the first end 32A.

The second bond pad 34 includes a second bond pad extension 34B that extends from the bonding region 34A along a side 32D of the substrate 32 toward a corner 35A of the substrate 32 at the first end 32A of the substrate 32.

First and second solder pads 46, 44 are formed on the second side 33 of the substrate 32. The first solder pad 46 is adjacent the first end 32A of the substrate 32, and the second solder pad 44 is adjacent the second end 32B of the substrate 32. The second bond pad 34 is in electrical contact with the first solder pad 46 and the first bond pad 36 is in electrical contact with the second solder pad 44.

The substrate 32 includes a castellation 40A at the corner 35A of the substrate 32. An electrical trace 42A on the castellation 40A extends from the first surface 31 of the substrate 32 to the second surface 33 of the substrate 32. The electrical trace 42 electrically connects the second bond pad 34 and the first solder pad 46.

The first bond pad further includes a first bond pad extension 36B that extends from the die attach region 36A along a second side 32C of the substrate 32, opposite the first side 32D of the substrate 32, towards a second corner 35B of the substrate 32 at the second end 32B of the substrate 32 and diagonally opposed to the first corner 35A across the substrate 32.

The substrate 32 includes a castellation 40B at the second corner 35B of the substrate 32. A second electrical trace 42B is formed in the second castellation 40B and extends from the first surface 31 of the substrate 32 to the second surface 33 of the substrate 32. The second electrical trace 42B electrically connects the first bond pad 36 and the second solder pad 44.

In some embodiments, the submount 30 may include at least one via hole 38 through the substrate 32 extending from the first surface 31 of the substrate 32 to the second surface 33 of the substrate 32. A conductive material, such as metal, deposited in the via hole 38 electrically connects the first bond pad 36 and the second solder pad 44, as shown in FIG. 2C.

The substrate 32 may include a nonconductive material such as alumina, aluminum nitride, silicon carbide and/or chemical vapor deposited (CVD) diamond on which a plurality of electrical traces (not shown) may be formed. The substrate 32 may in some cases include a composite of ceramics and/or organic materials and/or metals. The thermal conductivity of aluminum nitride and silicon carbide is about 200 W/MK, while the thermal conductivity of CVD diamond is about 800 W/MK. The thickness of the substrate 32 may be from about 150 to about 400 µm, although other thicknesses may be used.

In some embodiments, the specific heat of a material may be considered in selecting an appropriate material for the substrate 32. For example, in some applications, such as camera flashes, it may be desirable for a material to have a high thermal capacity (thermal mass) in order to absorb a high heat flux that is generated for a very brief time, which may increase the transient temperature dissipation time constant of the package. This may particularly be desirable for applications in which an external heatsink is not provided. As alumina may have about 44% more thermal capacitance than AlN, alumina may be an appropriate choice of material for the substrate 32 for some applications, and in particular for applications in which an external heat sink is not provided. In some embodiments, a 96% alumina substrate having a thickness of about 340 µm and a flatness of about 0.015 mm/linear mm may be used for the substrate 32.

The first bond pad 36 and the second bond pad 34 may include relatively thick traces for improved electrical and/or thermal conductivity. In particular, the first bond pad 36 and the second bond pad 34 may include about 75 µm thick copper plating.

Figure 2D:
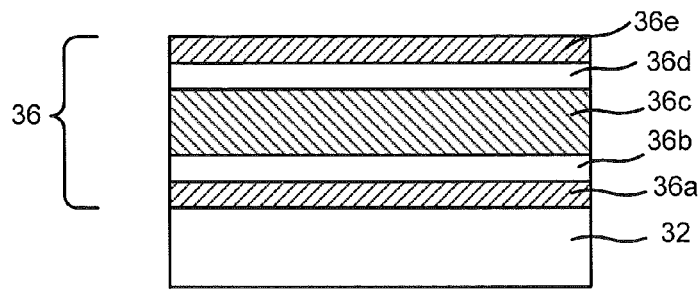
FIG. 2D is a partial cross section of a substrate including a metal stack according to some embodiments of the invention.

In some embodiments, the first bond pad 36 and the second bond pad 34 may be formed by sputtering a thin seed layer of platinum or titanium/platinum onto the substrate 32 and forming a thick layer on the seed layer. For example, the first bond pad 36 is illustrated in partial cross section in FIG. 2D. The first bond pad 36 includes a seed layer 36a, an optional first barrier layer 36b on the seed layer 36a, and a relatively thick thermal spreading layer 36c on the first barrier layer 36b. A second barrier layer 36d is on the thermal spreading layer 36c, and a reflector 36e is on the second barrier layer 36d. The second bond pad 34 will typically be formed at the same time as the first bond pad 36 and may have the same structure as the first bond pad 36.

The seed layer 36a, which may have a thickness of about 0.006 µm, may be sputtered onto the substrate 32 and then may be patterned using standard lithographic processes to form the desired outline of the bond pads 36, 34. The optional barrier layer 36b, which may include about 0.2 of nickel, may then be formed on the seed layer 36a.

A thermal spreading layer 36c as described above may then be formed on the seed layer 36a, for example, using an electrolytic or electroless plating technique. The thermal spreading layer 36c may include a layer of copper having a thickness of about 5 µm up to hundreds of microns thick, and in some cases may be about 75 µm thick. The thickness of the thermal spreading layer 36c will influence the heat transfer properties of the package. A thicker thermal spreading layer 36c may preferentially spread heat laterally, while a thinner thermal spreading layer 36c may preferentially spread heat vertically. Thus, a thinner thermal spreading layer 36c may be used with a substrate 32 having a larger thermal conductivity for vertical heat spreading.

A clean-up etch, such as a wet copper etch, may be performed to remove any material undesirably bridging between the bond pads 36, 34. The second barrier layer 36d, which may include nickel, may then be formed on the thermal spreading layer 36c. The second barrier layer 36d may have a thickness of about 0.2 µm to about 2 µm. The reflective layer 36e may be formed on the second barrier layer 36d. The reflective layer 36e may include silver having a thickness of 2 µm or more, and may improve light extraction.

A bonding layer (not shown), such as a layer of gold, may also be provided on the reflective layer 36e and/or the barrier layer 36d.

The thick thermal spreading layer 36c may provide improved heat spreading/extraction for the package. Furthermore, the thick thermal spreading layer 36 may enable heat to be quickly diffused into the core of the substrate 32. Once heat flux is diffused into the substrate 32, it may be extracted into an external heatsink, such as an MCPCB and/or heatsink fins, via a thermal joint. Heat may also be extracted from the substrate through natural and/or forced convection.

The electrical traces 42A, 42B and/or the first and second solder pads 46, 44 may be formed in a manner similar to the bond pads 36, 34. The vias 38 may be filled, for example, with copper.

An LED chip may be mounted onto the first bond pad 36 or the second bond pad 34 by solder joints, eutectoid joints, and/or Ag-epoxy joints. The first and/or second solder pad 46, 44 can be soldered or chemically bonded to external interconnects. It will be appreciated that any suitable surface of the substrate 32 can be metallized to form a terminal and/or heatsink pad for external electrical and/or heatsink interconnects to meet a particular application requirement.

Due in part to the configuration of the bond pads 36, 34, the castellations 40A, 40B, the vertical traces 42A, 42B and the solder pads 46, 44, an LED package as illustrated herein may include a substrate 32 having a single layer of material, which may simplify manufacturing processes and/or reduce manufacturing costs compared to packages including multiple layers for electrical routing purposes.

Furthermore, the use of castellations 40A, 40B to located the traces 42A, 42B may free up space on the surfaces 31, 33 of the substrate 32 that can be used, for example, for mounting chips, connecting wirebonds, or other purposes. The castellations 40A, 40B can also be used as electrical contacts, providing increased flexibility for mounting the package.

Figure 3A:
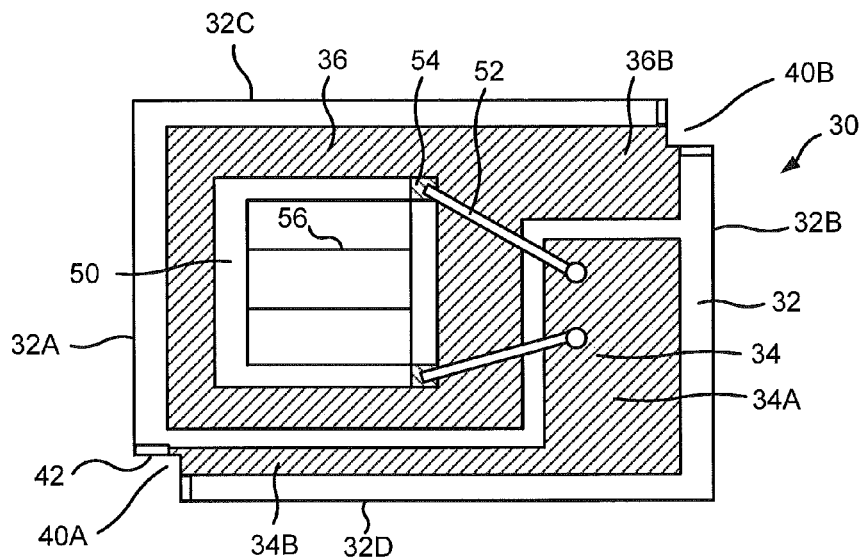
FIGS. 3A and 3B are plan and perspective views, respectively, of a submount for an LED package on which an LED chip has been mounted, according to some embodiments of the invention.
Figure 3B:
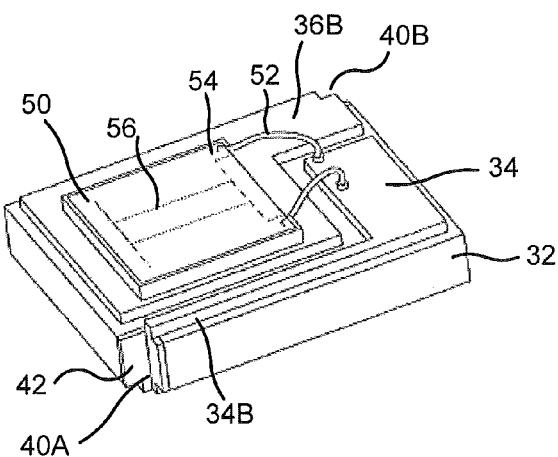

FIGS. 3A and 3B are plan and perspective views, respectively, of a submount 30 for an LED package on which an LED chip 50 has been mounted. The LED chip 50 includes a pair of bond pads 54 and a current spreading network 56 on an upper surface thereof. The bond pads 54 of the LED chip 50 may provide cathode (−) connections to the LED chip 50, while the anode (+) connection of the LED chip may be in electrical contact with the first bonding region 36A of the first bond pad 36. The cathode of the LED chip 50 is electrically connected to the bonding region 34A of the second bond bond pad 34 by at least one wire bond connection 52 that may include, for example, a gold or aluminum wire.

The cathode of the LED chip 50 is thereby electrically connected to the first solder pad 46 on the second side of the substrate 32, which is located adjacent the first end 32A of the substrate. Accordingly, both the center of the LED chip 50 and the solder pad 46 corresponding to the cathode of the LED chip 50 may be offset towards the same end of the substrate 32. This configuration may provide a desirable optical and/or electrical arrangement for the resulting package.

As can be seen in FIGS. 3A and 3B, a substrate 32 may have a surface area that is only about 2-3 times the size of the LED chip 50 mounted thereon, to provide a truly chip-scale package.

Figure 4A:
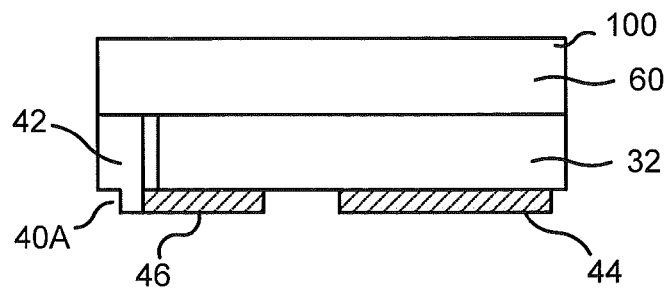
FIGS. 4A to 4C are side, top perspective and bottom perspective views, respectively, of an LED package according to some embodiments of the invention.
Figure 4B:
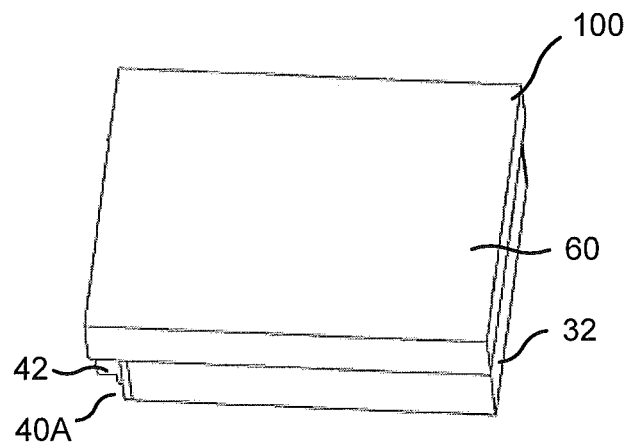
Figure 4C:
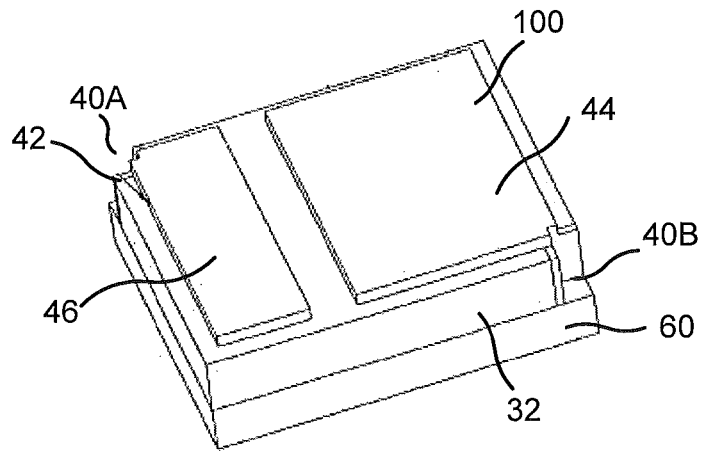

FIGS. 4A to 4C are side, top perspective and bottom perspective views, respectively, of an LED package 100 according to some embodiments of the invention. As shown in FIGS. 4A to 4C, an encapsulant 60 is formed over the first surface 31 of the substrate 32 to provide mechanical and/or environmental protection for the LED chip 50, as well as the first and second bond pads 36, 36 and the wire bond connections 52.

Accordingly, the finished package may have a three-dimensional solid body. While a rectangular body is illustrated in FIGS. 4A to 4C, the package body may have a rectangular, square, semihemispheric, parabolic or other regular and/or irregular shape.

The encapsulant 60 may be optically transparent and/or may provide an appropriate index of refraction to match the chip 50 encapsulated therein and/or to provide a transition to an external index of refraction in order to increase light extraction from the package.

Additives such as wavelength conversion materials (e.g. phosphors) and/or dispersers can be added to the encapsulant 60. In some embodiments, a wavelength conversion material, such a phosphors embedded in an optical medium such as a silicone gel can be coated onto the chip 50 before formation of the encapsulant 60.

Figure 5A:
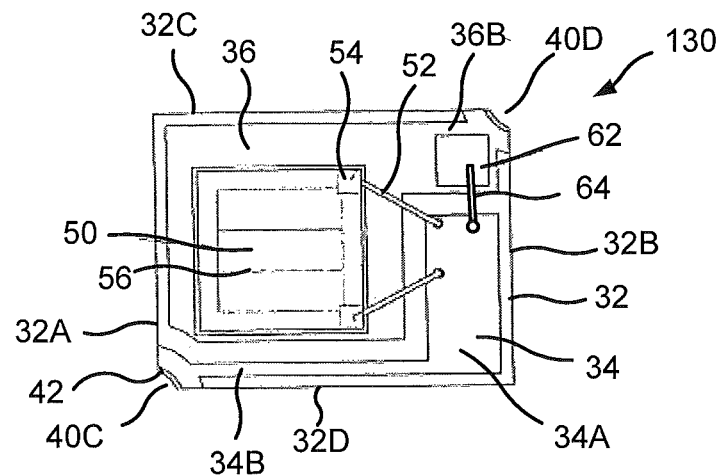
FIG. 5A and 5B are a plan and top perspective views, respectively, of a submount for an LED package on which an LED chip has been mounted, according to further embodiments of the invention.
Figure 5B:
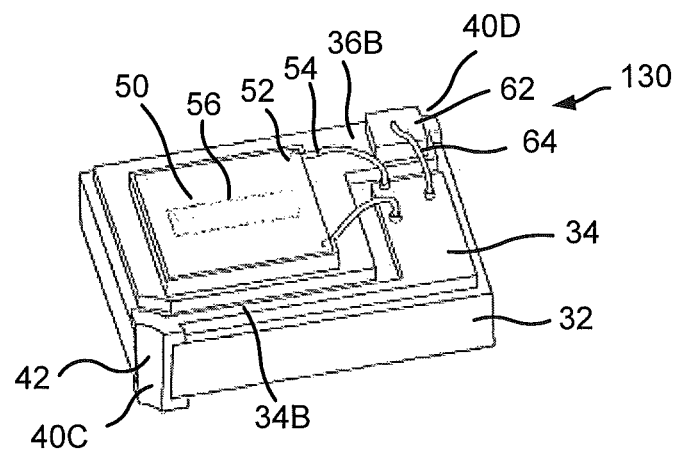

FIGS. 5A and 5B are plan and top perspective views, respectively, of a submount 130 for an LED package according to further embodiments of the invention. As shown therein, the substrate 32 may include generally semi-circular castellations 40C, 40D at opposite corners thereof.

Moreover, an electrostatic discharge (ESD) protection chip 62 may be mounted in parallel with the LED 50 to provide ESD protection to the LED chip 50. As shown in FIGS. 5A and 5B, the ESD protection chip is mounted on the first bond pad 36 along with the LED chip 50. In particular, the ESD chip 62 may be mounted on the first bond pad extension 36B. A wire bond connection 64 connects the ESD protection chip 62 to the second bond pad 34.

Figure 6A:
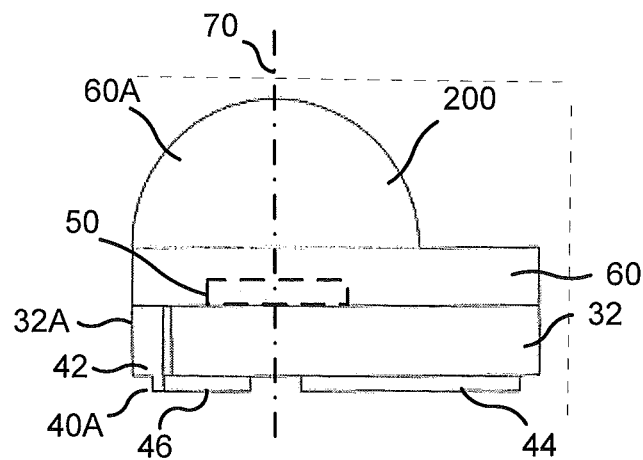
FIGS. 6A and 6B are side and perspective views, respectively, of an LED package according to further embodiments of the invention.
Figure 6B:
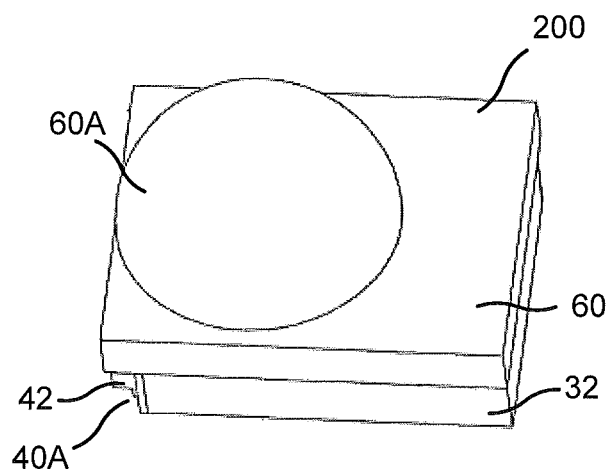

FIGS. 6A and 6B are side and perspective views, respectively, of an LED package 200 according to further embodiments of the invention. The LED package 200 includes an encapsulant 60 on the first side of the substrate 32. The encapsulant 60 includes an optical element, such as an integrated lens portion 60A that is offset from a center of the substrate 32 towards the first end 32A of the substrate. In particular, an optical axis 70 of the lens portion 60A may be vertically aligned with a center of the LED chip 50, which is also offset towards the first end 32A of the substrate 32.

An optical element, such as the lens portion 60A, that is integral with the encapsulant body 60 may improve the luminous efficiency of the package and/or may provide a desired radiation pattern for the packaged device.

As is apparent from FIGS. 6A and 6B, the optical center of the package may be placed in any desired location, including the geometrical center of the package. The bond pads 36, 34 may be modified from the configurations illustrated herein in order to achieve a package having a desired shape.

Furthermore, additional optical elements may be added to the package 100 after formation thereof. For example, a secondary optical element such as a lens, reflector and/or other imaging or non-imaging component can be bonded to the encapsulant 60 using a refractive index-matching adhesive.

Figure 7A:
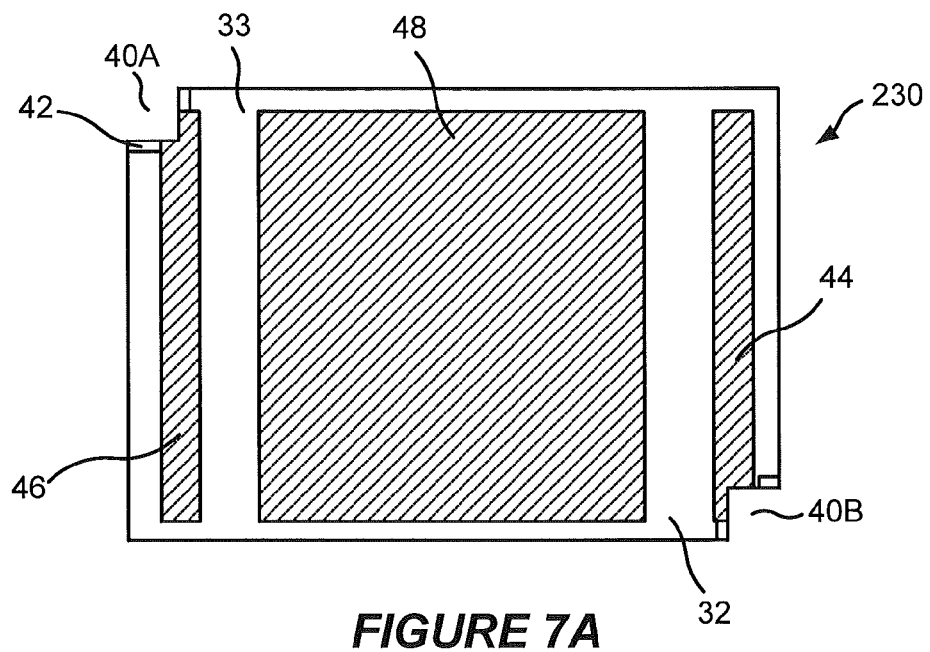
FIGS. 7A and 7B are bottom and perspective views, respectively, of a submount for an LED package according to further embodiments of the invention.
Figure 7B:
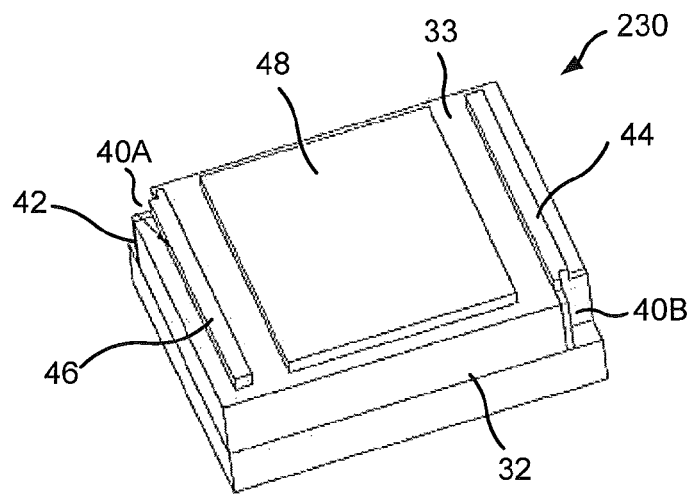

FIGS. 7A and 7B are bottom and perspective views, respectively, of a submount 230 for an LED package according to further embodiments of the invention. In addition to first and second solder pads 46, 44, the submount 230 includes a neutral pad 48 on the second surface 33 of the substrate 32 between the first solder pad 46 and the second solder pad 44. The neutral pad 48 is electrically isolated from the first solder pad 46 and the second solder pad 44, and may be used to provide a thermal connection between the submount 230 and a surface on which the submount 230 is mounted. The neutral pad 48 may have the same material composition as the first and second solder pads 46, 44 (which, in turn, may be formed in the manner described above with respect to the first and second bond pads 36, 34).

Figure 8:
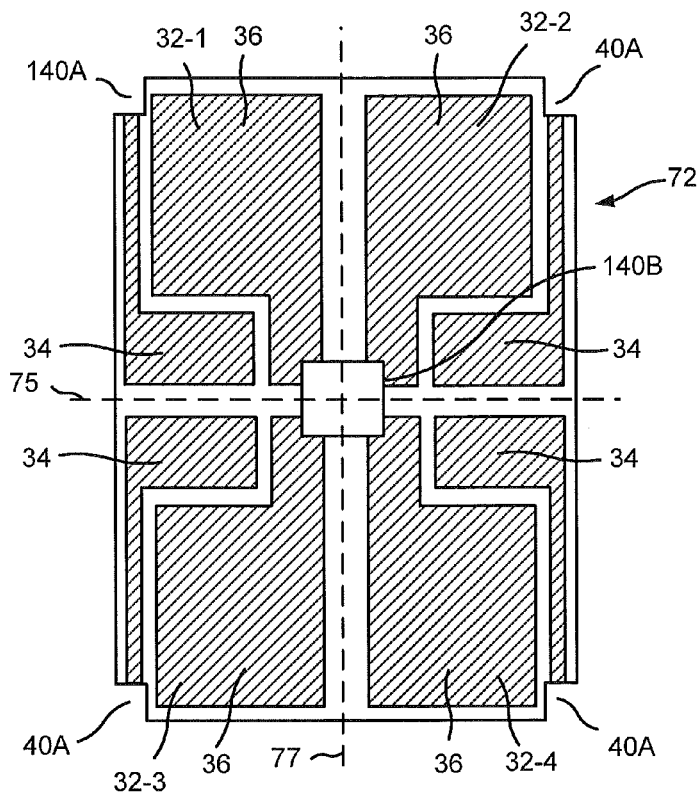
FIG. 8 is a plan view of a group of connected submounts prior to separation, according to some embodiments of the invention.

Some embodiments of the invention provide methods of forming submounts. In some embodiments, a sheet of a submount material, such as a sheet of ceramic material, may be patterned and metallized to form a plurality of connected submounts 32. For example, FIG. 8 is a plan view of a rectangular piece 72 including a group of four connected substrates 32-1 to 32-4 prior to separation thereof. The group of substrates 32-1 to 32-4 are defined by forming a square castellation hole 140B at a center of the rectangular piece 72, which forms the second castellation 40B for each of the substrates 32-1 to 32-4. Square castellation holes 140A are formed at the corners of the rectangular piece 72, and provide the first castellations 40A for each of the substrates 32-1 to 32-4. Since a single square castellation hole 140B forms four castellations 40B (i.e. one for each of the substrates 32-1 to 32-4), when the substrates 32-1 to 32-4 are separated along horizontal and vertical separation lines 75, 77, the size of the castellations 40B may be reduced.

Figure 9:
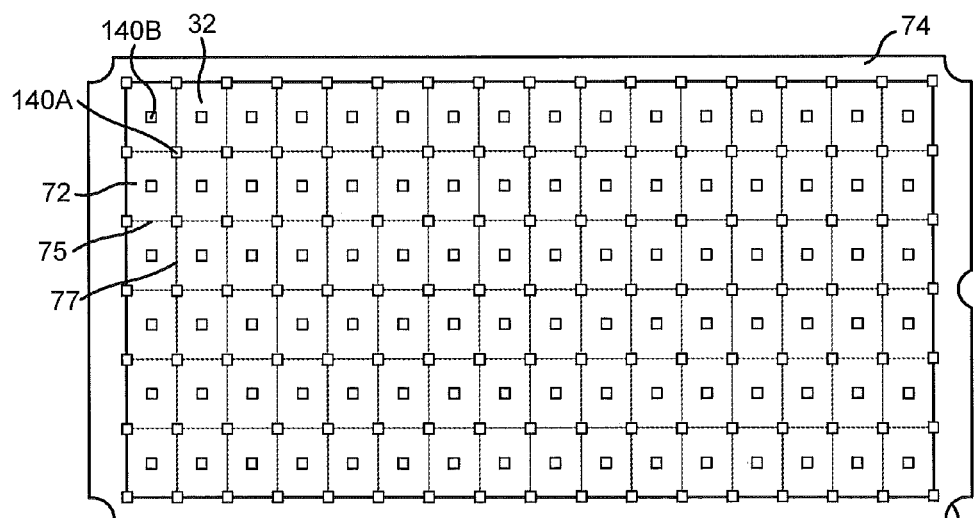
FIG. 9 is a plan view of a sheet of submounts according to some embodiments of the invention.

FIG. 9 is a plan view of a sheet 74 of rectangular pieces 72, each of which may include four substrates 32-1 to 32-4, according to some embodiments of the invention. Accordingly, the substrates 32 may be fabricated in large numbers by patterning and metallizing many substrates 32 at once. FIG. 9 also illustrates castellation holes 140B at the centers of the pieces 72 and castellation holes 140A arranged at corners of the pieces. When the individual substrates 32 are separated, for example by sawing the sheet 74 along horizontal separation lines 75 and vertical separation lines 77, each resulting substrate 32 will have first and second castellations 40A, 40B at opposite corners thereof on which electrical traces 42A and 42B are respectively formed. The sheet 74 may also include alignment features 73, such as ¼ circle holes at corners thereof and a ½ circle hole at an edge thereof, which may be used to align the sheet 74 in manufacturing processes from die attach through encapsulation and sawing.

Figure 10A:
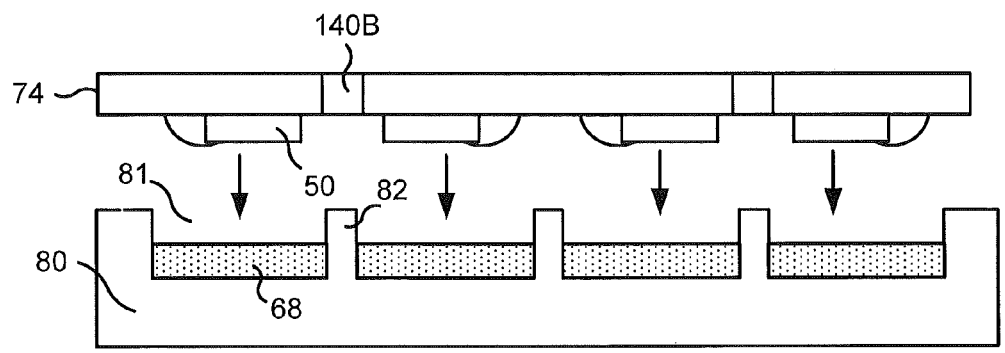
FIGS. 10A to 10C illustrate packaging systems/methods according to some embodiments of the invention.
Figure 10B:
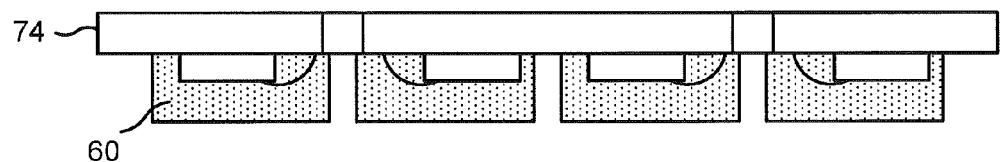
Figure 10C:
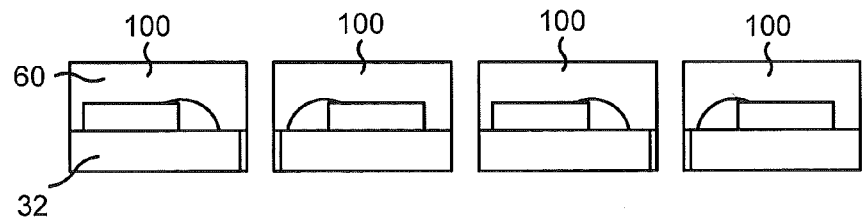

FIGS. 10A to 10C illustrate packaging systems/methods according to some embodiments of the invention. As shown therein, a mold 80 including a plurality of mold cavities 81 is provided. The mold cavities 81 are separated by sidewalls 82 and are arranged to correspond to individual submounts 30 in a sheet 74 of metallized submounts 30 on which LED chips 50 have been mounted. A liquid casting material 68, such as a clear liquid thermoset material, is dispensed into the cavities 81, and the sheet 74 is brought into contact with the mold 80 so that the LED chips 50 extend into the mold cavities 81 and become covered with the casting material 68. The casting material 68 is then at least partially cured, for example by heating.

After the casting material has been at least partially cured, the sheet 72 is separated from the mold 80, as shown in FIG. 10B, leaving solidified encapsulant coatings 60 on the LED chips 50. The submounts 30 may then be separated from one another, as shown in FIG. 10C, to form singulated packaged LEDs 100. In particular, the submounts 30 may be separated by sawing through the sheet 74 through the holes 140B, 140A, to leave castellations 40A, 40B in the corners of the substrates 32.

It may be beneficial to provide separate cavities 81 for each LED package being cast in order to reduce the effect of differences in coefficient of thermal expansion (CTE) between the casting material 68 and the material of the substrate sheet 74. For example, if the casting material 68 were cast over an entire sheet 74, differences in CTE between the casting material 68 and the sheet 74 may cause undesired cracking, warping and/or de-lamination of the encapsulant coatings 60.

Figure 11A:
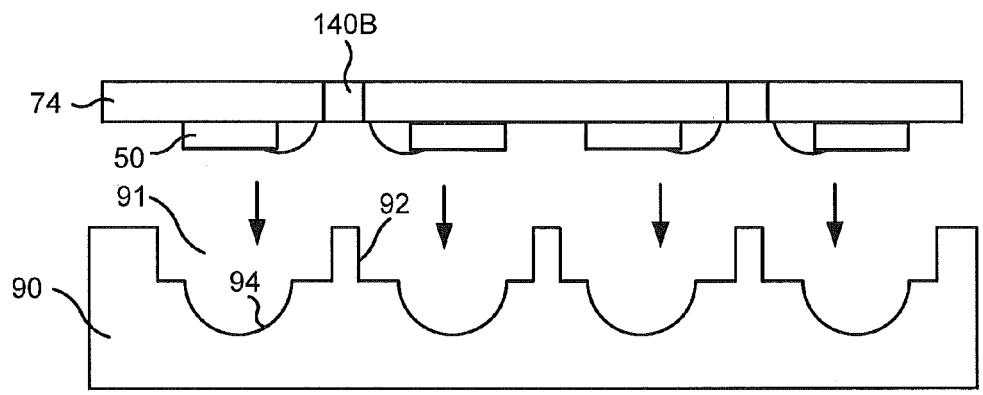
FIGS. 11A to 11C illustrate packaging systems/methods according to further embodiments of the invention.
Figure 11B:
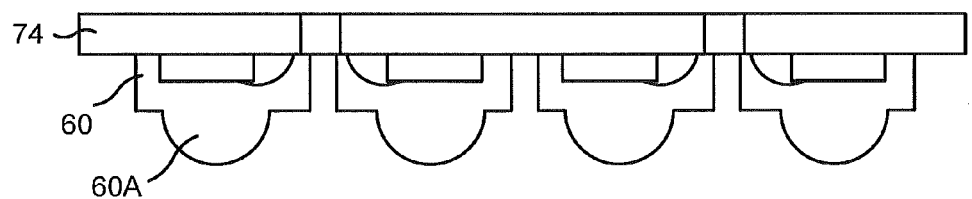
Figure 11C:
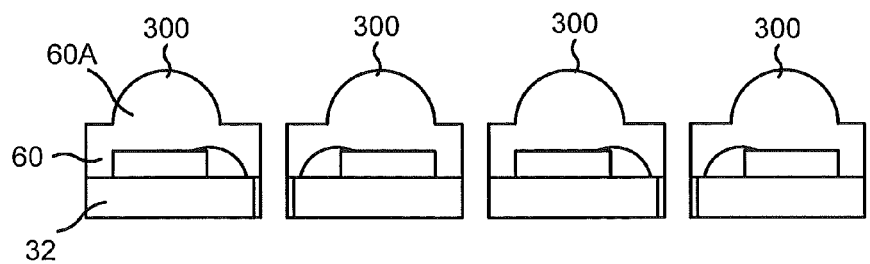

FIGS. 11A to 11C illustrate packaging systems/methods according to further embodiments of the invention. In the embodiments illustrated in FIGS. 11A to 11C, a mold 90 including a plurality of individual mold cavities 91 is provided. The individual mold cavities 91 are separated by sidewalls 92 and are arranged to correspond to individual submounts 30 in a sheet 74 of metallized submounts 30 on which LED chips 50 have been mounted. Furthermore, each mold cavity 91 includes a lens molding surface 94 that is shaped to mold the casting material 68 into a desired lens shape at a desired location on the substrate 32.

As shown in FIG. 11B, when the encapsulant 60 is formed, it includes an integral lens portion 60A corresponding to the lens molding surface 94.

Figure 12:
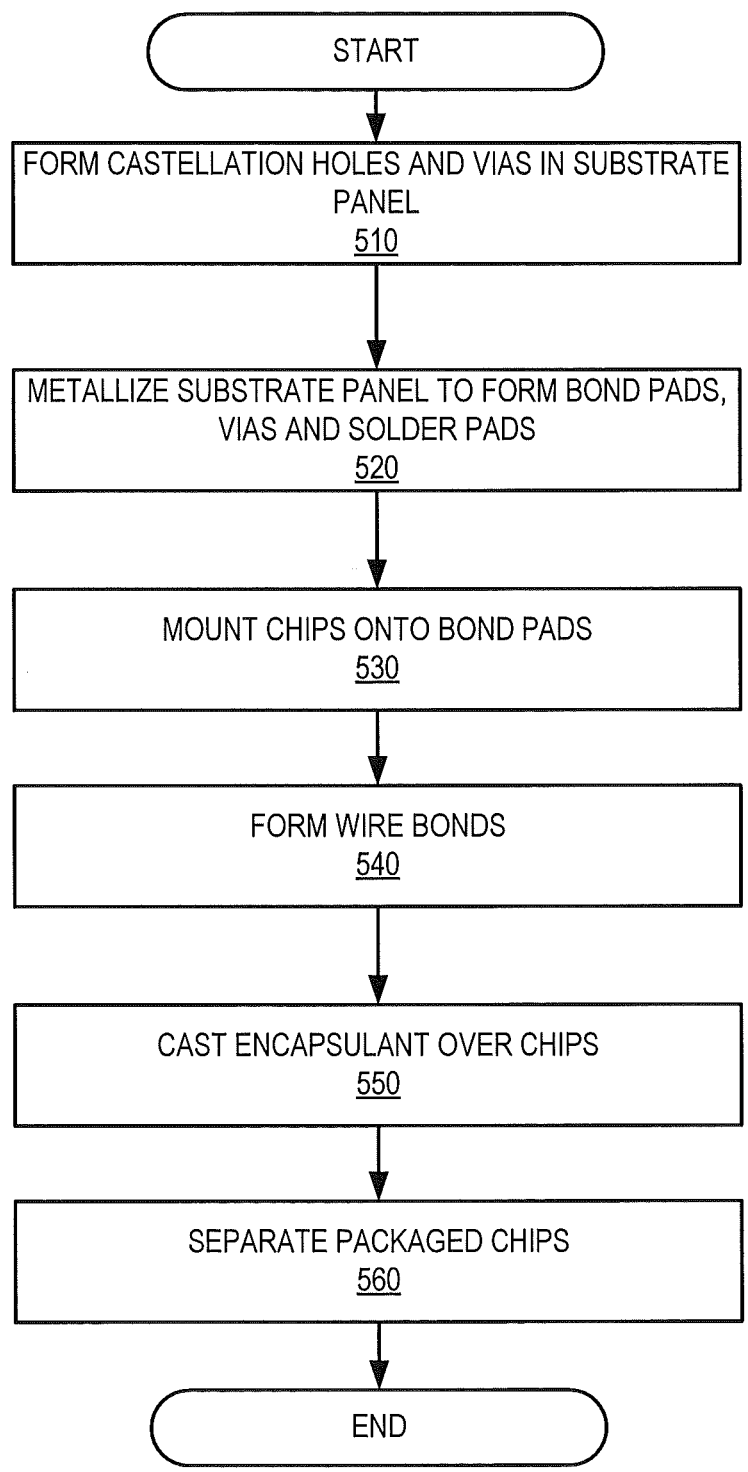
FIG. 12 is a flowchart illustrating systems/methods according to some embodiments of the invention. It's safe

FIG. 12 is a flowchart illustrating systems/methods according to some embodiments of the invention. A panel of substrate material, such as a panel of alumina and/or AlN is provided. A plurality of castellation holes 140B, and optionally, via holes 38, may be formed in the panel, for example, by etching (Block 510). The panel is then metallized to form bond pads, solder pads, and conductive vias in the via holes 38 and/or the castellation holes 140B (Block 520).

A plurality of LED chips are then mounted on respective bond pads on the panel (Block 530). Optionally, a plurality of ESD protection chips may also be mounted on corresponding bond pads. Wire bonds may then be formed from the chips to corresponding bond pads (Block 540).

An encapsulant material, such as a thermoset, may then be cast over the chips (Block 550). As described above, a mold including individual mold cavities may be at least partially filled with a liquid encapsulant material, and the panel may be placed in contact with the mold, so that the chips on the panel extend into the mold cavities. The mold may be pressurized, and may be at least partially cured before separating the panel from the mold.

A thermoset that may be used according to some embodiments of the invention may include an epoxy, polyimide, a phenolic resin and/or any other thermosettable material. A thermoset for use in some embodiments of the invention can be transfer molded onto a leadframe, such as a stamped or etched dual-gauge leadframe. Other types of molding may be used to form a body on a leadframe, such as injection molding and/or casting.

When the thermoset is chemically cross-linked (i.e., cured), it will chemically bond to the substrate to form a robust 3-dimensional solid thermoset body.

A thermoset body may offer enhanced structural and/or environmental protection to the device(s) mounted in the package compared to other types of materials.

Thermoset materials, such as thermosetting plastics are polymer materials that may be dispensed in precursor form, such as a resin, and then cured to a stronger form through the addition of energy, such as heat (generally near 200° C.) or irradiation. The curing process transforms the resin into a solid plastic by a cross-linking process in which the molecular chains of the material react at chemically active sites and link into a rigid, three-dimensional structure. The cross-linking process forms a molecule with a larger molecular weight, resulting in a material with a higher melting point or that simply changes to carbon and residue without melting. Thus, a thermoset material may not be melted and re-shaped after it is cured. As a result of the formation of a three-dimensional network of bonds during the cross-linking phase, thermoset materials are generally stronger than thermoplastic materials. Thus, thermoset materials may be better suited for high-temperature applications than thermoplastic materials.

Most thermosets, such as epoxy and/or polyimide, will bond to organic and/or inorganic surfaces when they come into contact with the surface during the cross-linking (curing) phase. This bond at the surface may be very strong and/or may be impervious to fluids or gases, such that a soft-gel encapsulant surrounding the semiconductor device(s) mounted in the package may not leak out. Furthermore, the bond between the thermoset and the leadframe may reduce or prevent the entry of moisture into the package, which could otherwise cause device failure.

In contrast, in a package including a thermoplastic molded body, there may be no bonding between the plastic body and the surface on which it is molded. As such, fluids and/or gases can pass in both directions through the interface between the thermoplastic and the leadframe. Accordingly, an advantage of using thermosets such as epoxy or phenolic resin may be found in the bonding and sealing properties of thermosets at the interface with an organic and/or inorganic surface on which it is molded. This bonding may reduce and/or prevent moisture and/or other fluids or gases from passing through the interface. Thus, a thermoset may provide a higher degree of hermeticity at the interface than a thermal plastic can offer.

Many thermosets can withstand temperatures in excess of 350° C. without becoming deformed or distorted. In general, thermosets may be able to withstand higher temperatures than conventional thermoplastic materials, such as PPA (e.g., Amodel®) and/or LCP (e.g., Vectra®), each of which can only withstand temperatures up to about 280° C. Accordingly, most thermal plastic materials cannot withstand the high solder reflow temperatures typically used for surface mount technology, which may be used to mount some LED packages.

Thermosets, such as many epoxies, can be molded by transfer molding, compression molding and/or casting processes to create plastic bodies having very fine details and/or intricate designs. During the molding/casting process, a thermoset may typically first transform into a flowable state before it is cured into a solid state. During this fluid state, high pressure can be applied to the material to allow the fluidic resin to fill even very small crevices in a mold. A thermal plastic may not be able to fill spaces as small as a thermoset can, because the injection mold for a thermal plastic is typically set at a temperature below the melting temperature of the thermal plastic, which may start to cool the thermal plastic to a solid state as soon as it enters the mold cavity.

Examples of thermoset materials are epoxy resins and phenol-novolac resins from Nitto Denko. Such materials may be loaded with filler particles, such as spherical fused silica and/or irregularly-shaped $TiO_2$ (titanium dioxide) solid particles, and/or carbon fibers at predetermined percentage by weight in order to obtain desired physical properties, such as coefficient of thermal expansion (CTE), flexural modulus, optical surface reflectance, heat deflection temperature (HDT), etc.

The thermoset resin, in solid or liquid form, is then loaded or dispensed into the mold cavity, which is set at a high temperature (typically at about 175° C.). Pressure (hundreds of psia) is applied to the thermoset resin to push the resin into the runner system of the mold. At this time, the solid resin will melt into a solution of very low viscosity. The liquid resin may then flow easily through the mold runners into the mold cavities, filling small crevices and corners. The pressure on the mold is increased to about 1,000 psia to pack the resin into the smallest gaps in the mold.

Inside the mold cavities, the liquid thermoset is continuously subjected to the high mold temperature of about 175° C. or more and a high material pressure of about 1,000 psia. Under these conditions, the liquid thermoset will solidify/cure in about 3-5 minutes. As noted above, when a thermoset cures, a cross-linking process occurs in which its constituent monomers or polymers chemically react with one another to form large, three-dimensional molecules that give solid thermoset material rigidity and a high melting point. The cross-linking action also causes the thermoset to chemically adhere or bond to the dual-gauge leadframe, imparting high mechanical stability to the resulting body/leadframe structure as well as providing a tight seal to the leadframe. This phenomenon of bonding may be desirable for a package for a semiconductor light emitting diode, in that an encapsulant can then be contained and retained inside without leaking out from the package.

Since the thermoset resin bonds readily to surfaces, the mold cavity may be made of hardened mold steel and polished to a mirror finish to reduce the tendency of the hardened thermoset to bond to the mold cavity. In addition, strong ejectors may be used to eject the molded panel from the mold. In some embodiments, the mold may have a Teflon® coating to promote separation and/or a mold release material may be provided in the cavities 81, 91 to promote separation.

After separation of the panel from the mold, the packaged chips may be separated from the panel (Block 560) to provide individual chip-scale packaged diodes.

Packaged light emitting diodes according to some embodiments of the invention may provide improved luminous flux per unit area, due in part to the chip-scale size of the package footprint. For example, a package according to some embodiments of the invention that includes a model EZXT-1000 LED power chip manufactured by Cree, Inc., operating at 350 mA and 100% duty cycle can deliver about 26 lumens/mm$^2$ or more. Such a package may be particularly useful in applications in which a small, lightweight package is desirable, such as portable security lights, camera flashes, and/or backlighting for portable electronic devices. Furthermore, some embodiments may be mounted together in a cluster to provide a high-intensity light source in applications such as automotive headlamps, brake lamps, traffic lamps, etc. Providing package-level optical elements, such as the lens 60A, may also ease the design and/or manufacture of secondary optical elements in systems using packages according to embodiments of the invention.

The foregoing description is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A light emitting device package, comprising:
   a substrate having a first surface and a second surface opposite the first surface, a first end and a second end opposite the first end;
   a first bond pad on the first surface of the substrate, wherein the first bond pad includes a die attach region offset from a center of the first surface toward the first end of the substrate and configured to receive a light emitting diode thereon;
   a second bond pad on the first surface of the substrate, wherein the second bond pad includes a bonding region that is between the first bond pad and the second end of the substrate and a second bond pad extension that continuously extends from the bonding region of the second bond pad along a side of the first surface of the substrate toward a corner of the substrate at the first end of the substrate; and
   first and second solder pads on the second surface of the substrate, wherein the first solder pad is adjacent the first end of the substrate and the second solder pad is adjacent the second end of the substrate, and wherein the second bond pad is in electrical contact with the first solder pad and the first bond pad is in electrical contact with the second solder pad.

2. The package of claim 1, wherein the encapsulant comprises an integrated lens arranged over the light emitting device, wherein the integrated lens has an optical axis that is aligned over a center of the light emitting device, so that the integrated lens is offset from a center of the substrate toward the first end of the substrate.

3. The package of claim 1, further comprising an ESD protection chip including an electrical contact, the ESD protection chip mounted on the first bond pad, and a second bond wire electrically connecting the electrical contact of the ESD protection chip and the second bond pad.

4. The package of claim 1, wherein the substrate includes a castellation at the corner of the substrate and an electrical trace on the castellation that extends from the second bond pad on the first surface of the substrate to the first solder pad on the second surface of the substrate.

5. The package of claim 1, wherein the first bond pad further comprises a first bond pad extension that extends from the die attach region along a second side of the substrate towards a second corner of the substrate at the second end of the substrate.

6. The package of claim 5, wherein the substrate includes a castellation at the second corner of the substrate, and a second electrical trace on the second castellation that extends from the first surface of the substrate to the second surface of the substrate and that electrically connects the first bond pad and the second solder pad.

7. The package of claim 6, wherein the corner and the second corner are diagonally opposed to one another across the substrate.

8. The package of claim 1, further comprising a neutral pad on the second surface of the substrate between the first solder pad and the second solder pad, wherein the neutral pad is electrically isolated from the first solder pad and the second solder pad.

9. The package of claim 1, wherein the substrate comprises an electrically insulating material.

10. The package of claim 9, wherein the substrate comprises aluminum nitride and/or alumina.

11. The package of claim 1, further comprising at least one via hole through the substrate extending from the first surface of the substrate to the second surface of the substrate, and a conductive material in the at least one via hole and electrically connecting the first bond pad and the second solder pad.

12. The package of claim 1, wherein the encapsulant comprises a wavelength conversion material and/or a disperser.

13. The package of claim 1, further comprising a wavelength conversion material between the light emitting device and the encapsulant.

14. The package of claim 1, further comprising a secondary optical element on the encapsulant.

15. The package of claim 1, further comprising a light emitting device having an electrical contact and mounted on the first bond pad.

16. The package of claim 15, further comprising a bond wire bonded to the electrical contact of the light emitting device and to the second bond pad.

17. The package of claim 1, further comprising an encapsulant on the first surface of the substrate.

18. The package of claim 1, wherein the first bond pad is in electrical contact with the second solder pad at the second end.

19. The package of claim 1, wherein the second solder pad is positioned closer to the second end than the first end.

* * * * *